United States Patent
Xie

(10) Patent No.: US 8,344,743 B2
(45) Date of Patent: Jan. 1, 2013

(54) TESTING SYSTEM FOR POWER SUPPLY UNIT

(75) Inventor: Ling-Yu Xie, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 390 days.

(21) Appl. No.: 12/771,118

(22) Filed: Apr. 30, 2010

(65) Prior Publication Data

US 2011/0169521 A1 Jul. 14, 2011

(30) Foreign Application Priority Data

Jan. 13, 2010 (CN) .......................... 2010 1 0300243

(51) Int. Cl.
*G01R 31/10* (2006.01)
(52) U.S. Cl. ......... 324/750.05; 324/750.01; 324/750.02; 324/750.03; 324/750.04; 324/750.06
(58) Field of Classification Search . 324/750.01–750.06
See application file for complete search history.

(56) References Cited

U.S. PATENT DOCUMENTS

| | | | |
|---|---|---|---|
| 5,361,626 A * | 11/1994 | Colligan et al. | 73/40.7 |
| 2002/0075024 A1* | 6/2002 | Fredeman et al. | 324/760 |
| 2006/0132106 A1* | 6/2006 | Lucas et al. | 323/267 |
| 2008/0151452 A1* | 6/2008 | Ren | 361/86 |

* cited by examiner

*Primary Examiner* — Jermele M Hollington
*Assistant Examiner* — Son Le
(74) *Attorney, Agent, or Firm* — Altis Law Group, Inc.

(57) ABSTRACT

A testing system for a PSU includes a test chamber and a control device. The test chamber includes a first partition with the PSU accommodated therein and a second partition with an electric load accommodated therein. The PSU is electrically connected to the electric load. The control device includes a microcontroller unit (MCU). The MCU is connected to a setting circuit and a temperature sensing circuit. The setting circuit is configured to set one of predetermined parameters. The temperature sensing circuit is capable of sensing temperature in the test chamber. The MCU is capable of automatically controlling a predetermined temperature in the test chamber and presetting a test time for testing the PSU.

12 Claims, 7 Drawing Sheets

TESTING SYSTEM FOR POWER SUPPLY UNIT

BACKGROUND

1. Technical Field

The present disclosure relates to a testing system for testing a power supply unit (PSU).

2. Description of Related Art

A PSU is an electric device capable of converting an alternating current (AC) source to a plurality of direct current (DC) output voltages to a load (e.g., personal computer). Before the PSU is used in the personal computer, the PSU should pass several tests (e.g., burn-in test, power cycling test, etc). A typical testing system includes a test chamber and a control device connected to the test chamber. A plurality of PSUs can be placed in the test chamber. An operator can operate buttons of the control device to preset a test time and a temperature in the test chamber. Then the testing system can performs the burn-in test and the power cycling test to the plurality of PSUs. However, the typical testing system is cumbersome and power-consuming.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean at least one.

Figure 1:
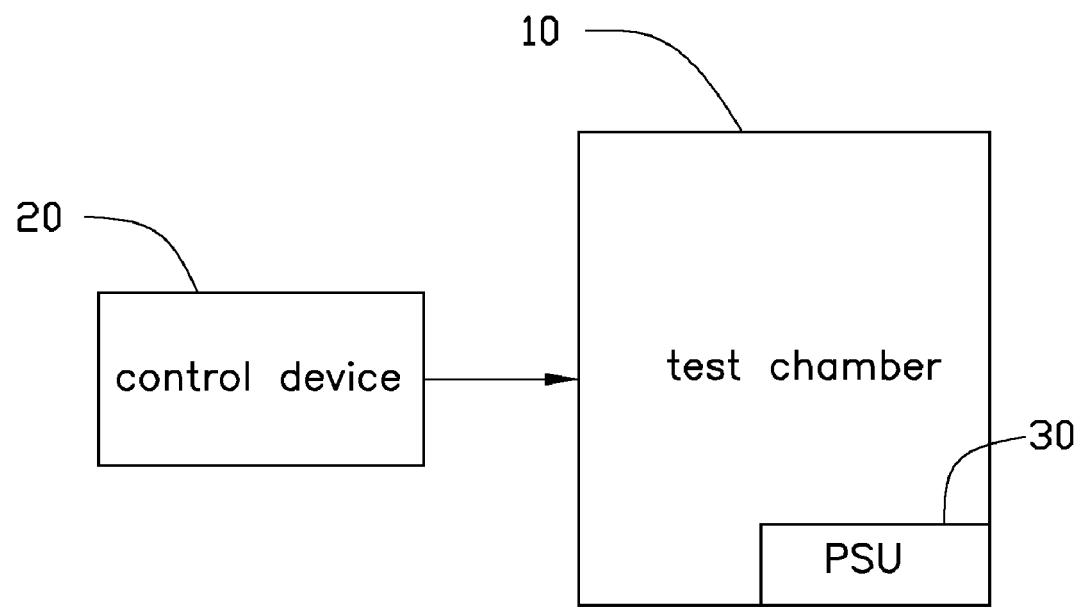
FIG. 1 is a block diagram of a testing system for testing a PSU according to an embodiment.

Referring to FIG. 1, an embodiment of a testing system includes a test chamber 10 and a control device 20 connected to the test chamber 10. The test chamber 10 and the control device 20 can perform a burn-in test and a power cycling test to a PSU 30 accommodated in the test chamber 10.

Figure 2:
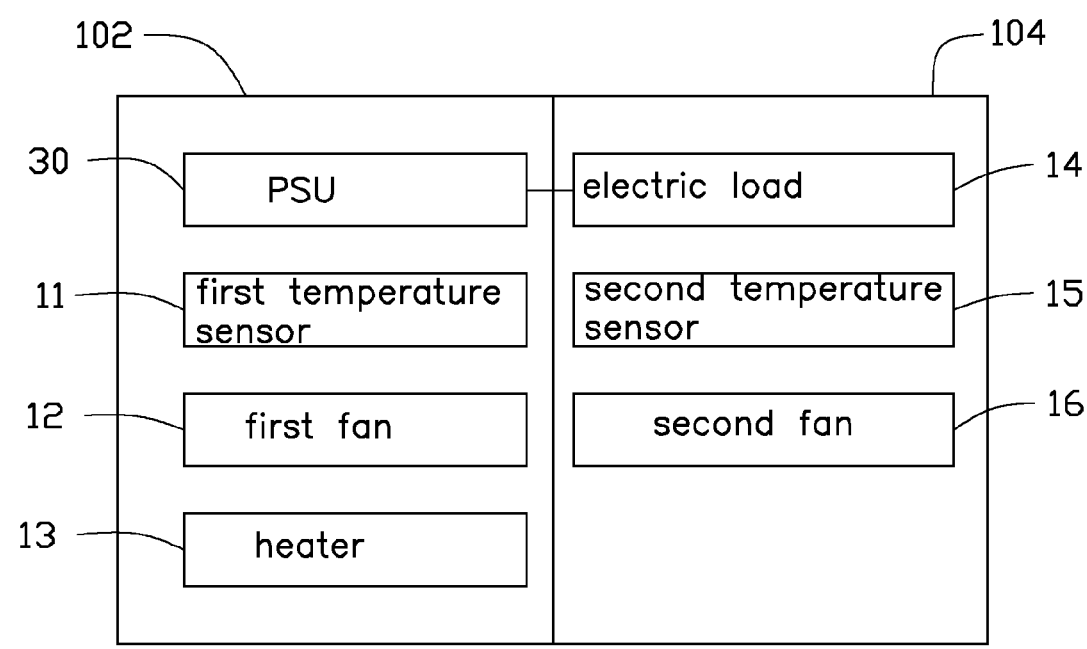
FIG. 2 depicts a detailed block diagram of a test chamber according to an embodiment.

Referring to FIG. 2, the test chamber 10 includes a first partition 102 and a second partition 104. The PSU 30 is placed in the first partition 102. A first temperature sensor 11, a first fan 12, and a heater 13 are installed in the first partition 102. The first temperature sensor 11 is configured to sense a temperature in the first partition 102. The control device 20 switches on the first fan 12 if the temperature in the first partition 102 exceeds a predetermined value (e.g., 45° C.) or switches on the heater 13 if the temperature in the first partition 102 is less than the predetermined value. Thus, the PSU 30 can be tested under a predetermined temperature. An electric load 14, a second temperature sensor 15, and a second fan 16 are mounted in the second partition 104 of the test chamber 10. The PSU 30 is electrically connected to the electric load 14. The second temperature sensor 15 is configured to sense a temperature in the second partition 104. The control device 20 switches on the first fan 12 if the temperature in the first partition 102 exceeds a second predetermined value (e.g., 25° C.), thereby keeping a temperature in the second partition less than 25° C.

Figure 3:
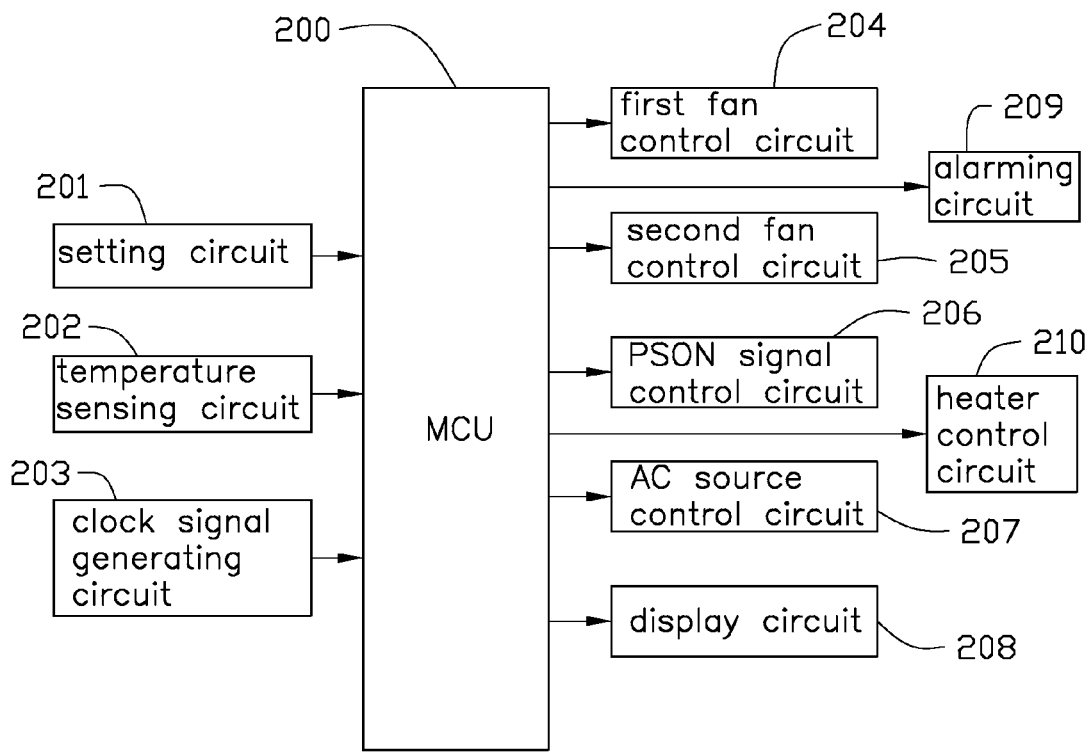
FIG. 3 depicts a detailed block diagram of a control device according to an embodiment.
Figure 4:
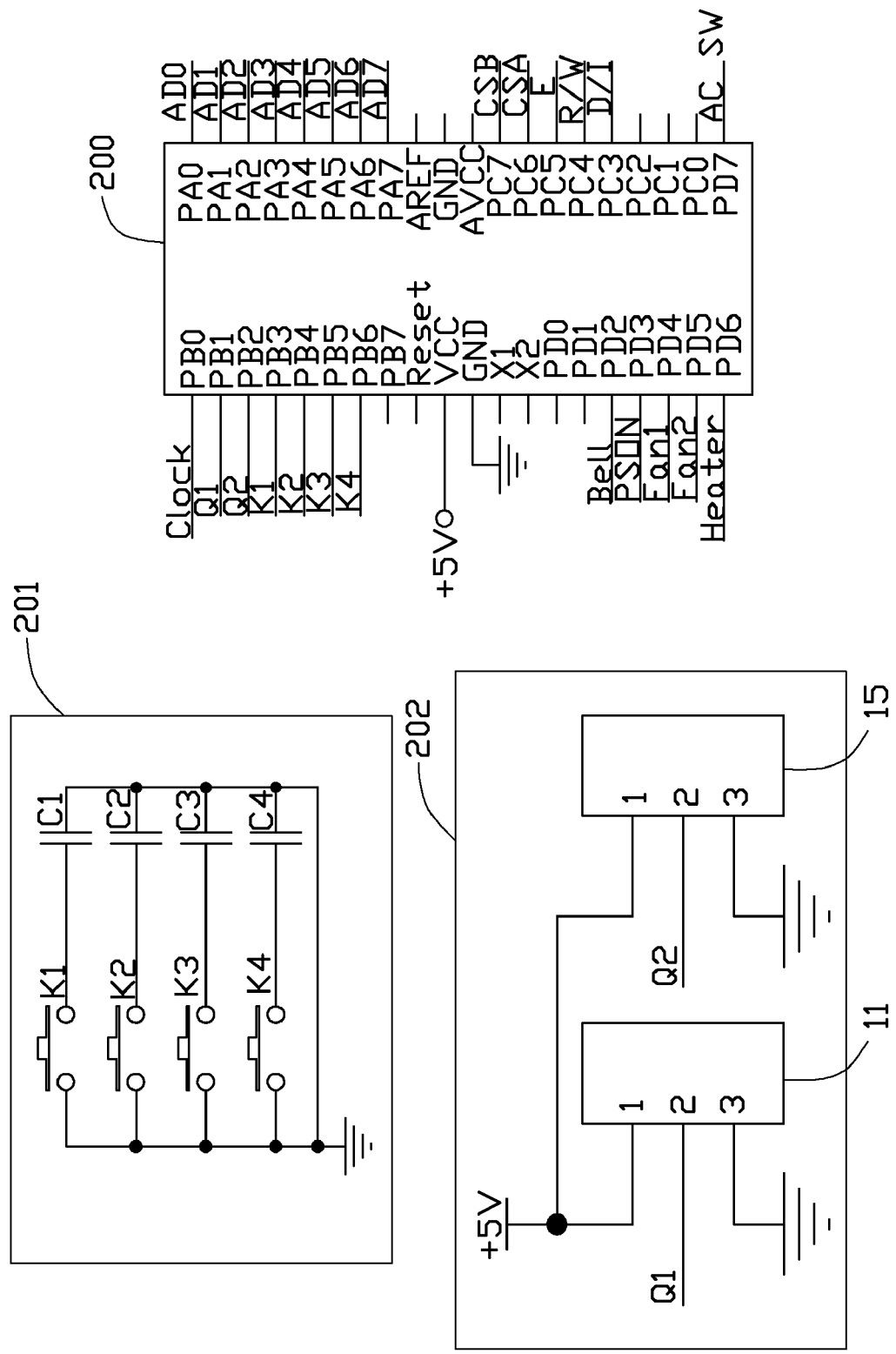
FIGS. 4-7 depict a detailed circuit of the control device in FIG. 3.
Figure 5:
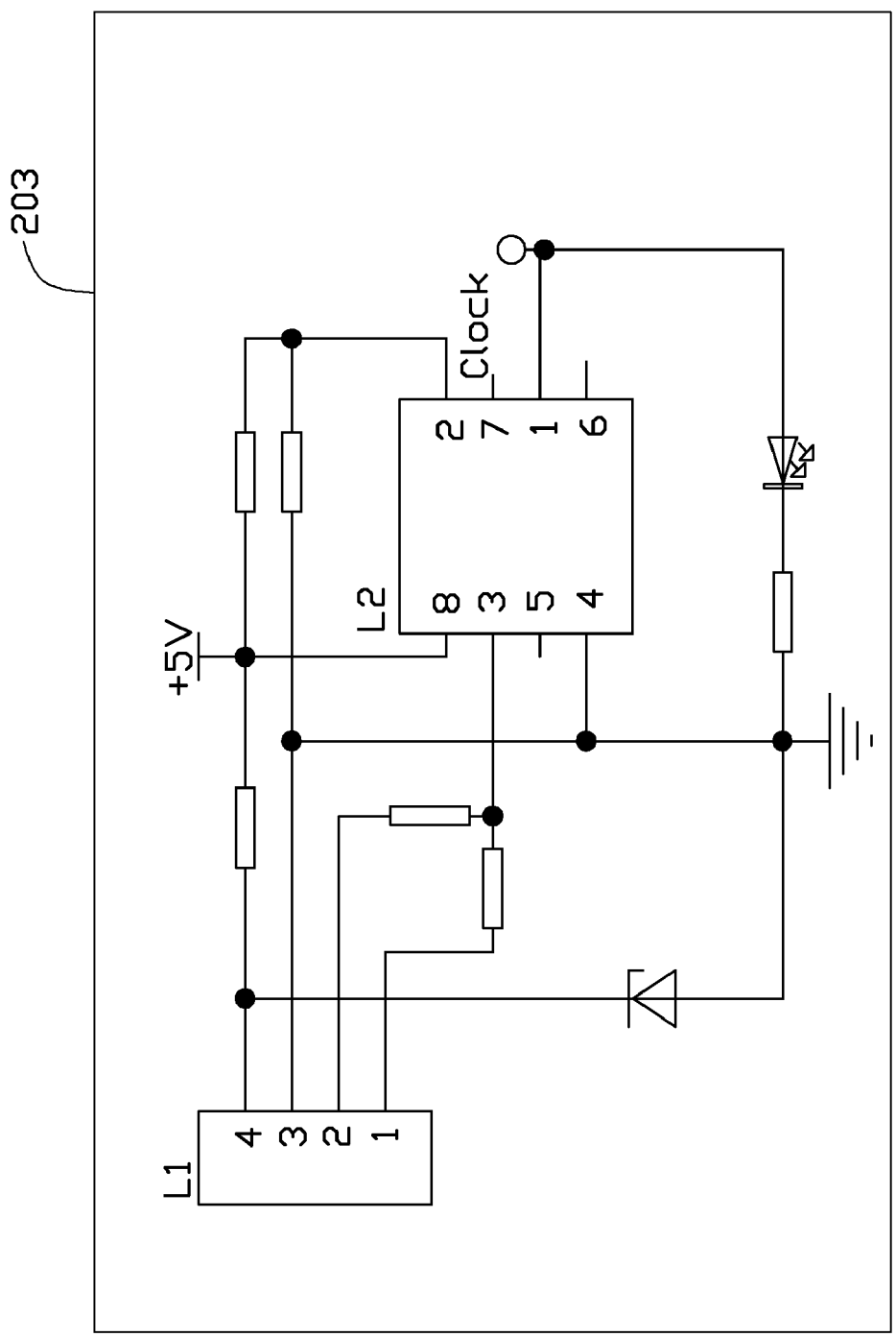
Figure 6:
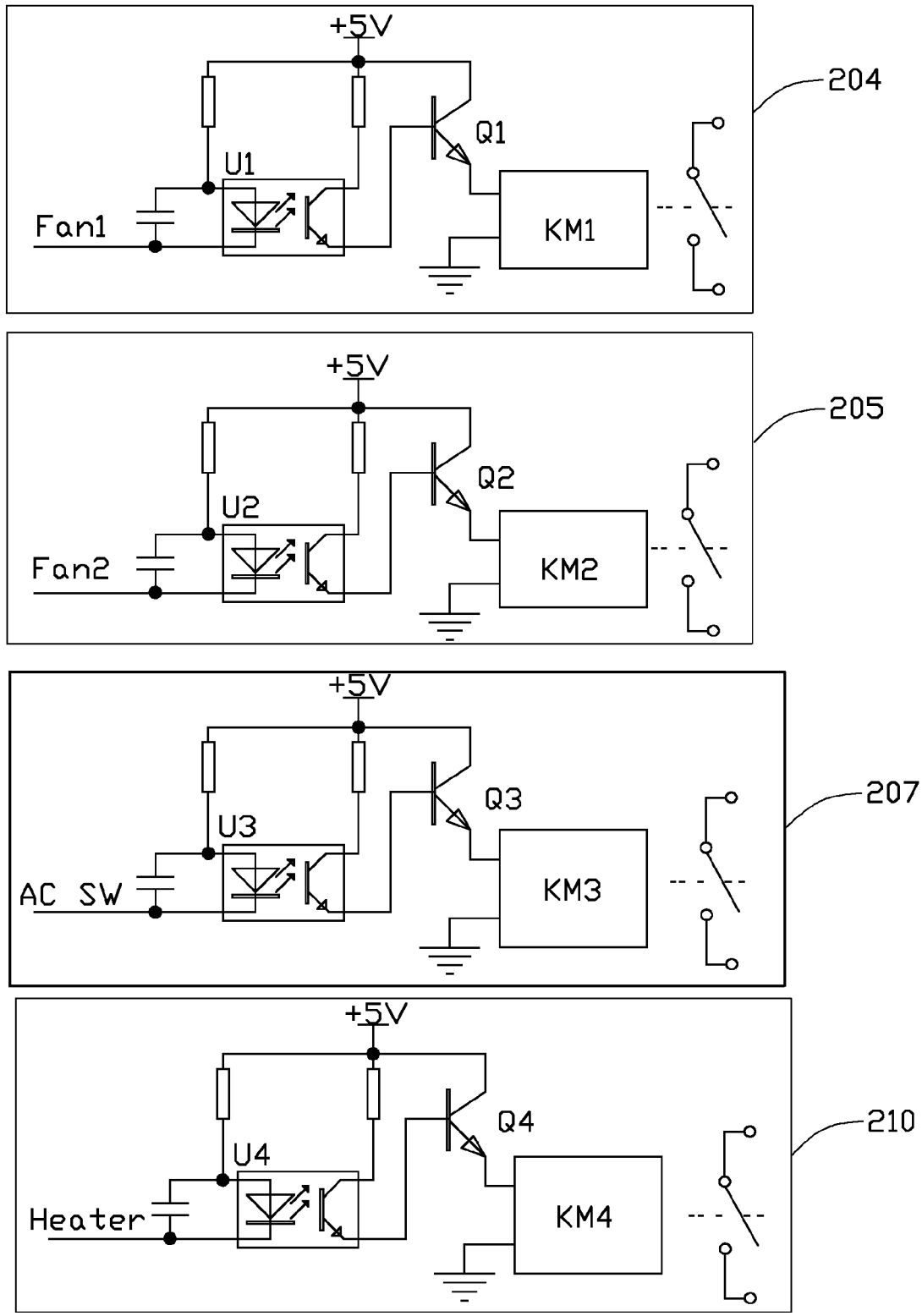
Figure 7:
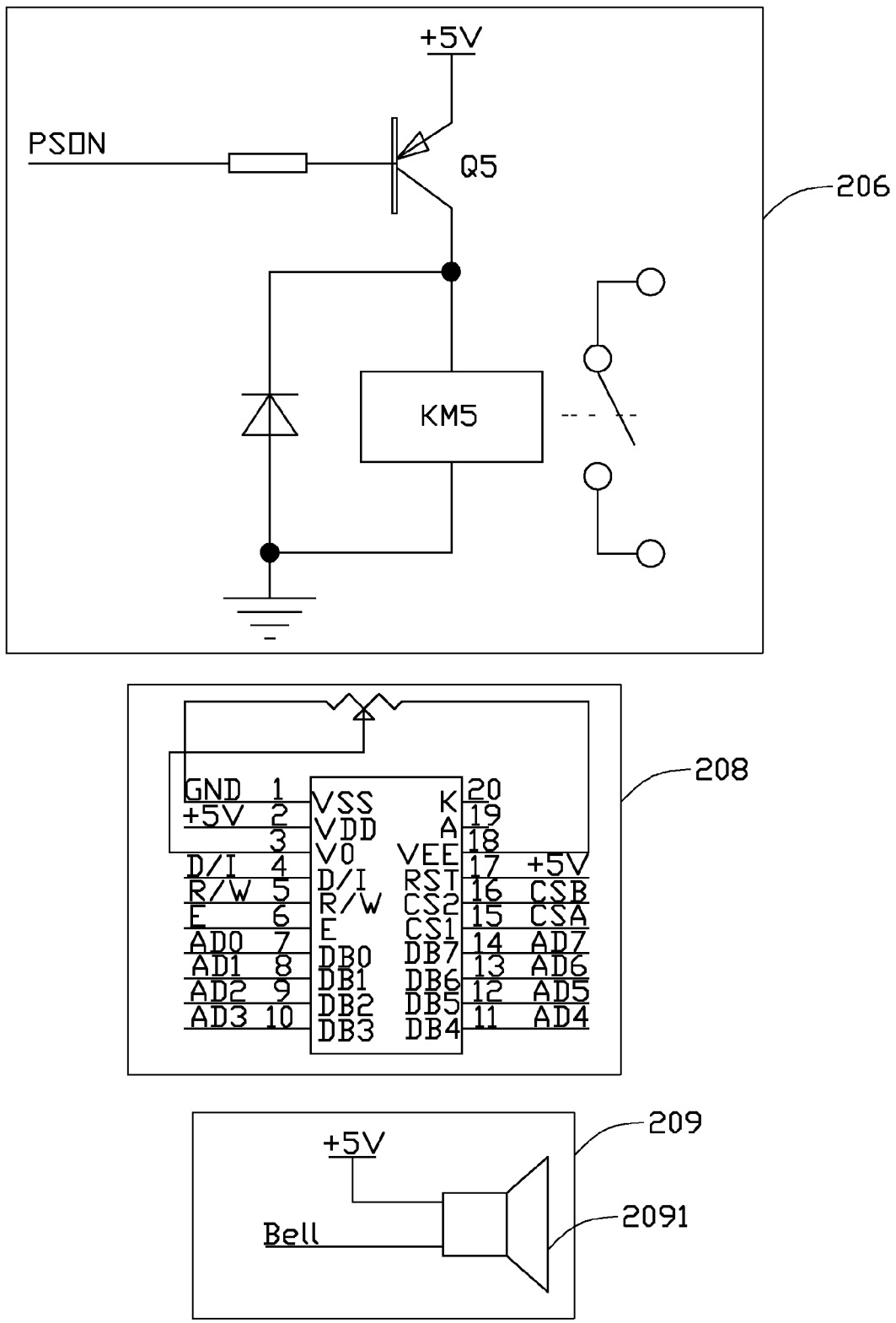

Referring to FIG. 3, the control device 20 includes a microcontroller unit (MCU) 200 with a plurality of I/O ports for transmitting/receiving signals. The MCU 200 is connected to a plurality of input circuits including a setting circuit 201, a temperature sensing circuit 202, and a clock signal generating circuit 203. The MCU 200 is further connected to a plurality of output circuits including a first fan control circuit 204, a second fan control circuit 205, a PSON (Power On) signal control circuit 206, an alternating current (AC) source control circuit 207, a display circuit 208, an alarming circuit 209, and a heater control circuit 210. The MCU 200 receives signals from the input circuits and outputs signals to control the output circuits.

Referring to FIGS. 4-7, the setting circuit 201 includes a first key K1, a second key K2, a third key K3, and a fourth key K4 respectively connected to pins PB3-PB6 of the MCU 200. The first key K1 is configured for setting one of the test parameters after it has been triggered. For example, if the key switch K1 is actuated to set a test time, the test time can be shown by the display circuit 208. If the first key K1 is actuated again to set a temperature in the first partition 102 of the test chamber 10, the temperature in the first partition 102 can be shown by the display circuit 208 rather than the test time. If the first key K1 is actuated again to set a temperature in the second partition 104 of the test chamber 10, the temperature in the second partition 104 can be shown by the display circuit 208. The second key K2 is configured to increase a value of one of the test parameters. The third key K3 is configured to decrease a value of one of the test parameters. For example, if the temperature in the first partition 102 of the test chamber 10 is set and shown by the display circuit 208 as an initialization value of 44° C., the cycle time may be changed to 45° C. after the second key K2 has been triggered once, or may be to 43° C. after the third key K3 has been triggered once. The fourth key K4 is configured to affirm and enter the setting.

The temperature sensing circuit 202 includes the first temperature sensor 11 and the second temperature sensor 15 respectively connected to pins PB1 and PB2 of the MCU 200 for providing temperature information to the MCU 200.

The clock signal generating circuit 203 includes a clock signal generating chip L1 and an amplification chip L2. The clock signal generating chip L1 is configured to generate a clock signal, and the amplification chip L2 is configured to amplify the clock signal and output the amplified clock signal to a pin PB0 of the MCU 200.

The first fan control circuit 204 includes an optical isolator U1, an NPN-type transistor Q1, and a first relay KM1 configured to switch on/off the first fan 12. The optical isolator U1 includes a light-emitting diode (LED) and a phototransistor. When an electrical signal is applied to the input of the optical isolator U1, its LED lights and illuminates the phototransistor, producing a corresponding output signal. The optical isolator U1 uses a short optical transmission path to transfer an electronic signal between an input terminal and an output terminal in a circuit, while keeping them electrically isolated, thereby preventing signal interference in the circuit. An input terminal of the optical isolator U1 is connected to a pin PD4 of the MCU 200. A first output terminal of the optical isolator U1 is coupled to a +5V power supply via a resistor, and a second output terminal of the optical isolator U1 is connected to a base terminal of a transistor Q1. A collector terminal of the transistor Q1 is connected to the +5V power supply. An emitter terminal of the transistor Q2 is connected to the first relay KM1. When the first temperature sensor 11 senses that the temperature in the first partition 102 of the test chamber 10 exceeds a first predetermined value (e.g., 45° C.), the MCU 200 sends a TTL low signal to the optical isolator U1. The LED of the optical isolator U1 lights and illuminates the phototransistor. The transistor Q1 is rendered conductive and turns on the first relay KM1. Thus, the first fan 12 is switched on for decreasing the temperature in the first partition 102 of the test chamber 10.

The second fan control circuit 205 includes an optical isolator U2, an NPN-type transistor Q2, and a second relay KM2 configured to switch on/off the second fan 16. When the second temperature sensor 15 senses that the temperature in the second partition 104 of the test chamber 10 exceeds a second predetermined value (e.g., 25° C.), the MCU 200 sends a TTL low signal to the optical isolator U2. The optical isolator U2 is turned on, and the transistor Q2 is rendered conductive and turns on the second relay KM2. Thus, the second fan 16 is switched on for decreasing the temperature in the second partition 104 of the test chamber 10.

The PSON signal control circuit 206 includes a PNP-type transistor Q3 and a third relay KM3. A pin PD3 of the MCU 200 is connected to an input terminal of the PSON signal control circuit 206 and sends signals to automatically power on or off the PSU 30.

The AC source control circuit 207 includes an optical isolator U3, an NPN-type transistor Q4, and a fourth relay KM4. A pin PD7 of the MCU 200 is connected to an input terminal of the AC source control circuit 207 and sends signals to disconnect or connect to the PSU 30 to an AC power source.

The display circuit 208 includes a display module 2081. Pins DB0-DB7 of the display module 2081 are respectively connected to pins PA0-PA7 of the MCU 200. The MCU 200 can send signals to the display module 2081, and the display module 2081 can display corresponding information thereon. In one embodiment, the display module 2081 is a GXM12864 liquid crystal display module.

The alarming circuit 209 includes a speaker 2091 capable of generating audible signals to indicate an end of the test.

The heater control circuit 210 includes an optical isolator U4, an NPN-type transistor Q5, and a fifth relay KM5 configured to switch on/off the heater 13. When the first temperature sensor 11 senses that the temperature in the first partition 102 of the test chamber 10 is less than the first predetermined value (e.g., 45° C.), the MCU 200 sends a TTL low signal to the heater control circuit 210 to switch on the heater 13. If the temperature in the first partition 102 of the test chamber 10 exceeds the first predetermined value (e.g., 45° C.), the MCU 200 sends signals to switch off the heater 13 and switch on the first fan 12 for maintaining a constant temperature in the first partition 102 of the test chamber 10.

In one embodiment, the testing system can perform a burn-in test on the PSU 30. During the burn-in test, the PSU 30 is caused to work under a high temperature and for a long time to determine whether elements of the PSU 30 withstand the work conditions. The testing system can further perform a power cycling test to the PSU 30. During the power cycling test, the MCU 200 sends signals to the PSON signal control circuit 206 for repeatedly switching on or off the PSU 30 according to a predetermined sequence.

The above described testing system has following advantages: 1) the control device 20 of the testing system uses the MCU 200 to control the test chamber 10 rather than a typical cumbersome control device, and is inexpensive and power-saving; 2) it is convenient for users to set parameters using the keys K1-K4.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A testing system for a power supply unit (PSU) comprising:
   a test chamber comprising a first partition configured to accommodate the PSU therein and a second partition with an electric load accommodated therein, with the electric load electrically connected to the PSU;
   a control device comprising a microcontroller unit (MCU) connected to a setting circuit and a temperature sensing circuit, the setting circuit configured to set predetermined parameters, the temperature sensing circuit capable of sensing temperature in the test chamber, and the MCU capable of automatically controlling the test chamber to perform a test of the PSU according to the predetermined parameters;
   the temperature sensing circuit comprises a first temperature sensor located in the first partition of the test chamber and a second temperature sensor located in the second partition of the test chamber, the first temperature sensor is capable of sensing temperature in the first partition, and the second temperature sensor is capable of sensing temperature in the second partition;
   the test chamber further comprises a first fan installed in the first partition, the MCU is connected to a first fan control circuit that is configured to switch on the first fan if the temperature in the first partition exceeds a first predetermined value;
   the heater control circuit comprises an optical isolator, a transistor, and a relay connected to the heater, an input terminal of the optical isolator is connected to the MCU, an output terminal of the optical isolator is connected to a base terminal of the transistor, a collector terminal of the transistor is supplied with a direct current (DC) power supply, and an emitter of the transistor is connected to the relay.

2. The testing system of claim 1, wherein the test chamber further comprises a second fan installed in the second partition, the MCU is connected to a second fan control circuit that is configured to switch on the second fan if the temperature in the second partition exceeds a second predetermined value.

3. The testing system of claim 1, wherein the setting circuit comprises a first key configured to select one of the predetermined parameters, a second key configured to increase a value of one of the predetermined parameters, a third key configured to decrease the value of one of the predetermined parameters, and a fourth key configured to enter and confirm the setting.

4. The testing system of claim 1, wherein the MCU is connected to an alarming circuit capable of generating audible sound when the tests ends.

5. A testing system for testing at least one power supply unit (PSU), the testing system comprising:
   a test chamber comprising a first partition with the PSU accommodated therein and a second partition with an electric load accommodated therein, the electric load being connected to the PSU;
   a control device comprising a microcontroller unit (MCU);
   a setting circuit, connected to the MCU, configured to set a test time, temperature in the first partition, or temperature in the second partition;
   a temperature sensing circuit, connected to the MCU, capable of sensing temperature in the first partition and temperature in the second partition;

wherein the MCU is capable of controlling temperature in the first partition and the second partition during a predetermined test time;

the setting circuit comprises a first key configured to select the test time, temperature in the first partition, or temperature in the second partition, a second key is configured to increase a value of the test time, temperature in the first partition, or temperature in the second partition, a third key is configured to decrease a value of the test time, temperature in the first partition, or temperature in the second partition, and a fourth key is configured to enter and confirm the setting.

6. The testing system of claim 5, wherein the temperature sensing circuit comprises a first temperature sensor located in the first partition of the test chamber and a second temperature sensor located in the second partition of the test chamber, the first temperature sensor is capable of sensing temperature in the first partition, and the second temperature sensor is capable of sensing temperature in the second partition.

7. The testing system of claim 6, wherein the test chamber further comprises a first fan installed in the first partition, the MCU is connected to a first fan control circuit that is configured to switch on the first fan if the temperature in the first partition exceeds a first predetermined value.

8. The testing system of claim 7, wherein the test chamber further comprises a second fan installed in the second partition, the MCU is connected to a second fan control circuit that is configured to switch on the second fan if the temperature in the second partition exceeds a second predetermined value.

9. The testing system of claim 7, wherein the test chamber further comprises a heater installed in the first partition, the MCU is connected to a heater control circuit that is configured to switching on the heater if the temperature in the first partition is lower than the first predetermined value.

10. The testing system of claim 9, wherein the heater control circuit comprises an optical isolator, a transistor, and a relay connected to the heater, an input terminal of the optical isolator is connected to the MCU, an output terminal of the optical isolator is connected to a base terminal of the transistor, a collector terminal of the transistor is supplied with a direct current (DC) power supply, and an emitter of the transistor is connected to the relay.

11. The testing system of claim 5, wherein the MCU is connected to an alarming circuit that is capable of generating audible sound to indicate an end of the test.

12. The testing system of claim 5, wherein the MCU is connected to a Power On (PSON) signal control circuit, the PSON signal control circuit is configured to switching on or off the at least one PSU.

\* \* \* \* \*